(12) United States Patent
Astafyeva et al.

(10) Patent No.: US 12,292,147 B2
(45) Date of Patent: May 6, 2025

(54) FLUID CONNECTION AND FLUID HEATING DEVICE

(71) Applicant: HUTCHINSON, Paris (FR)

(72) Inventors: Ksenia Astafyeva, Montargis (FR); Thierry Benard, Checy (FR)

(73) Assignee: HUTCHINSON (FR)

( * ) Notice: Subject to any disclaimer, the term of this patent is extended or adjusted under 35 U.S.C. 154(b) by 331 days.

(21) Appl. No.: 17/793,612

(22) PCT Filed: Jan. 18, 2021

(86) PCT No.: PCT/EP2021/050966
§ 371 (c)(1),
(2) Date: Jul. 18, 2022

(87) PCT Pub. No.: WO2021/148359
PCT Pub. Date: Jul. 29, 2021

(65) Prior Publication Data
US 2023/0053652 A1 Feb. 23, 2023

(30) Foreign Application Priority Data

Jan. 20, 2020 (FR) ..................................... 2000529

(51) Int. Cl.
*F16L 53/38* (2018.01)
*F01M 13/00* (2006.01)
(Continued)

(52) U.S. Cl.
CPC ............... *F16L 53/38* (2018.01); *F16L 25/01* (2013.01); *H05K 3/105* (2013.01);
(Continued)

(58) Field of Classification Search
CPC ....... F01N 2610/10; F16L 25/01; F16L 53/38; H05K 3/105
See application file for complete search history.

(56) References Cited

U.S. PATENT DOCUMENTS 5,970,962 A * 10/1999 Nelson ................... F01M 13/00
123/573
2006/0196448 A1 9/2006 Hayworth et al.
(Continued)

FOREIGN PATENT DOCUMENTS

DE 202009016368 U1 4/2011
EP 1421265 A1 5/2004
(Continued)

OTHER PUBLICATIONS

Karolis et al., Laser-induced selective metallization of polypropylene doped with multiwall carbon nanotubes, Applied Surface Science, vol. 412, 2017, pp. 319-326, ISSN 0169-4332, https://doi.org/10.1016/j.apsusc.2017.03.238.(https://www.sciencedirect.com/science/article/pii/S0169433217309340) (Year: 2017).*
(Continued)

*Primary Examiner* — Kevin A Lathers
(74) *Attorney, Agent, or Firm* — Dickinson Wright PLLC

(57) ABSTRACT

A fluidic connection and fluid heating device for a fluid circuit, in particular for a motor vehicle, the device comprising a one-piece tubular body of plastic or composite material comprising at least one internal annular surface defining a fluid flow duct from an inlet to an outlet of the body and at least one external annular surface extending around the duct and on which is located at least one resistive heating element, wherein the resistive heating element is a resistive circuit which is formed in situ on the annular surface.

19 Claims, 7 Drawing Sheets

(51) Int. Cl.
*F16L 25/01* (2006.01)
*H05K 3/10* (2006.01)

(52) U.S. Cl.
CPC .. *F01M 2013/0027* (2013.01); *F01N 2610/02* (2013.01); *F01N 2610/10* (2013.01); *H05K 2201/10977* (2013.01); *H05K 2203/107* (2013.01); *H05K 2203/121* (2013.01)

(56) References Cited

U.S. PATENT DOCUMENTS

| | | |
|---|---|---|
| 2008/0099000 A1 | 5/2008 | Suzuki et al. |
| 2013/0336643 A1 | 12/2013 | Borgmeier et al. |

FOREIGN PATENT DOCUMENTS

| | | |
|---|---|---|
| EP | 2363627 A1 | 9/2011 |
| EP | 2619495 A1 | 7/2013 |
| FR | 2516439 A1 | 5/1983 |
| FR | 2943718 A1 | 10/2010 |
| FR | 2994892 A1 | 3/2014 |
| FR | 3030994 A1 | 6/2016 |
| JP | 86233497 A | 2/1987 |
| KR | 20160012746 A | 2/2016 |
| WO | 2011139898 A1 | 11/2011 |

OTHER PUBLICATIONS

International Search Report and Written Opinion with English Translation for PCT Application No. PCT/EP2021/050966, dated Mar. 23, 2021, 14 pages.

\* cited by examiner

FLUID CONNECTION AND FLUID HEATING DEVICE

CROSS-REFERENCE TO RELATED APPLICATION(S)

The present application is a U.S. national phase application of International Patent Application No. PCT/EP2021/050966, filed on Jan. 18, 2021, which claims priority to French Patent Application No. FR2000529, filed on Jan. 20, 2020, the disclosures of which are hereby incorporated by reference in their entireties.

TECHNICAL FIELD OF THE INVENTION

The present invention relates in particular to a fluidic connection and fluid heating device, in particular for a motor vehicle, this device may for example be used for an application such as connecting an air intake end-piece to a blow-by pipe of the gases of an internal combustion thermal engine.

TECHNICAL BACKGROUND

A blow-by pipe of the gases of an internal combustion thermal engine, for the passage of gases from the combustion chamber to the casing of the engine, is widely known as "blow-by". Generally speaking, the function of the quick connectors in motor vehicles is to connect the fluid transfer pipes to the members of the engine. In particular, fluidic connection and fluid heating devices are used in pollution control systems where the gaseous residues of the combustion of the engine, which accumulate in the engine casing and contain water in particular, are reinjected to the air intake pipe. In very cold weather, this water can freeze and cause the pipe to become blocked, which can lead, in case of blockage, to an increase in pressure in the engine casing, which in turn can lead to an evacuation of the lubricating oil contained in the engine casing from the measuring gauge sockets. This can result in significant damage to the engine.

In the present technique, such a connection device comprises means for heating the fluid. The fluid to be heated circulates in a tube which is heated.

The document FR-A1-2 943 718 describes a fluid connection device for this application.

Another application for a heating fluidic connection device is a pollution control circuit SCR (acronym for Selective Catalytic Reduction).

In the document EP-A1-2 363 627, a fluid conduit comprises a heating wire that is wound around a connector made of plastic material for this other application.

However, these technologies are not entirely satisfactory because the devices are complex and therefore long and costly to produce. The use of a heating wire, for example, requires the manual winding of the wire around the connector, the quality of this manual operation having an impact on the quality of the heating and its reproducibility.

Therefore, there is a need for a fluidic connection and fluid heating device that comprise a limited number of parts in order to simplify its manufacture and to reduce its manufacturing cost.

SUMMARY OF THE INVENTION

The present invention proposes an improvement to the above technologies that allows to address the needs of the prior art.

The present invention relates to a fluidic connection and fluid heating device for a fluid circuit, in particular for a motor vehicle, this device comprising a one-piece tubular body made of plastic or composite material comprising:
- an inlet and an outlet each equipped with fluidic connection means, which are of the press-fit or male/female cooperation type,
- at least one internal annular surface defining a fluid flow duct from the inlet to the outlet of the body, and
- at least one external annular surface extending around the duct and on which is located at least one resistive heating element, the resistive heating element is a resistive circuit which comprises at least one elongated resistive track whose longitudinal ends are connected to electric connection terminals which are oversized with respect to the or each track so as to be connected to electrical wires or lugs, said circuit being formed in situ on said at least one external annular surface. The resistive element is thus in the form of a circuit that is directly formed on at least one annular surface of the body of the device. The formation of the heating circuit directly on the body allows to eliminate the mounting step of the resistive element of the prior art, as well as the associated disadvantages. This also allows the production of a series of bodies with identical heating circuits and thus identical fluid heating capacities. The in-situ formation of the circuit also allows to eliminate any gaps or clearances between the resistive element and the body, which tend to impair the heating efficiency of the fluid.

The terminals are also formed directly on the body, which facilitates the electric connection of the track. For this purpose, the terminals are oversized with respect to the track and in particular are widened (they comprise a width greater than that of the tracks) so that they are each adapted to receive a welding point.

The device according to the invention may comprise one or more of the following characteristics, taken alone or in combination with each other:
- the resistive track forms a serpentine;
- the resistive track has a width less than or equal to 5 mm, and for example less than or equal to 1 mm;
- the terminals are welded to the ends of electric wires or to electric lugs;
- electric lugs are integrated into the body and connected to the terminals by simple contact;
- the circuit extends all-around said at least one external annular surface;
- said at least one external annular surface is cylindrical or frustoconical;
- the circuit extends continuously over a plurality of adjacent external annular surfaces;
- the circuit extends all over the entire circumference of a bottom of an annular gorge;
- the circuit has a thickness less than or equal to 0.5 mm;
- the circuit extends over a surface area of at least 100 mm$^2$, and preferably at least 250 mm$^2$;
- the circuit has a length of between 5 and 100 mm, and for example between 5 and 50 mm, and a diameter of between 6 and 80 mm;
- the circuit is configured to provide a thermal power of between 0.5 and 10 W; and
- the circuit is at least partially covered and protected by a coating material of the body, for example thermoplastic; and
- a passivation layer or dielectric layer covers at least one portion of the circuit and in particular said at least one track;

said passivation layer or dielectric layer covers contact or welding points connecting the terminals to the electric wires or lugs.

The present invention also relates to a fluid circuit, in particular for a motor vehicle, comprising at least one device as described above. This is for example an SCR circuit.

The present invention also relates to a method for manufacturing a device as described above, wherein it comprises a step of realizing the circuit by a technique selected from printing a resistive or conductive ink and the selective metallization.

A resistive ink is often an ink with a semi-conductive filler (carbon type). It would also be possible to realize a resistive track with a conductive ink (charged with metal) by adapting for example the dimensions of the track.

The selective metallization can be realized by laser (optional) and then immersion in one or more metallization baths (electrolytic or non-electrolytic deposition). The laser can be used to realize a chemical modification of the treated surface and/or to increase the roughness of this surface.

The material of the body may comprise an additive intended to be laser activated and to facilitate the attachment of one or more metal layers during the immersion or the successive immersions.

Alternatively, the material of the body could not contain a laser-activatable additive and the surface of the body could be chemically activated by immersion in one or more chemical activation baths before being metallized.

The body can be made by two-material injection into a mould, of a first material having an affinity for an electrically conductive and resistive material, and a second, non-electrically conductive material.

The ink can be printed by inkjet, aerosol jet, stamping, or any other suitable technique.

BRIEF DESCRIPTION OF THE FIGURES

Further characteristics and advantages of the invention will become apparent from the following detailed description, for the understanding of which reference is made to the attached drawings in which.

DETAILED DESCRIPTION OF THE INVENTION

Figure 1:
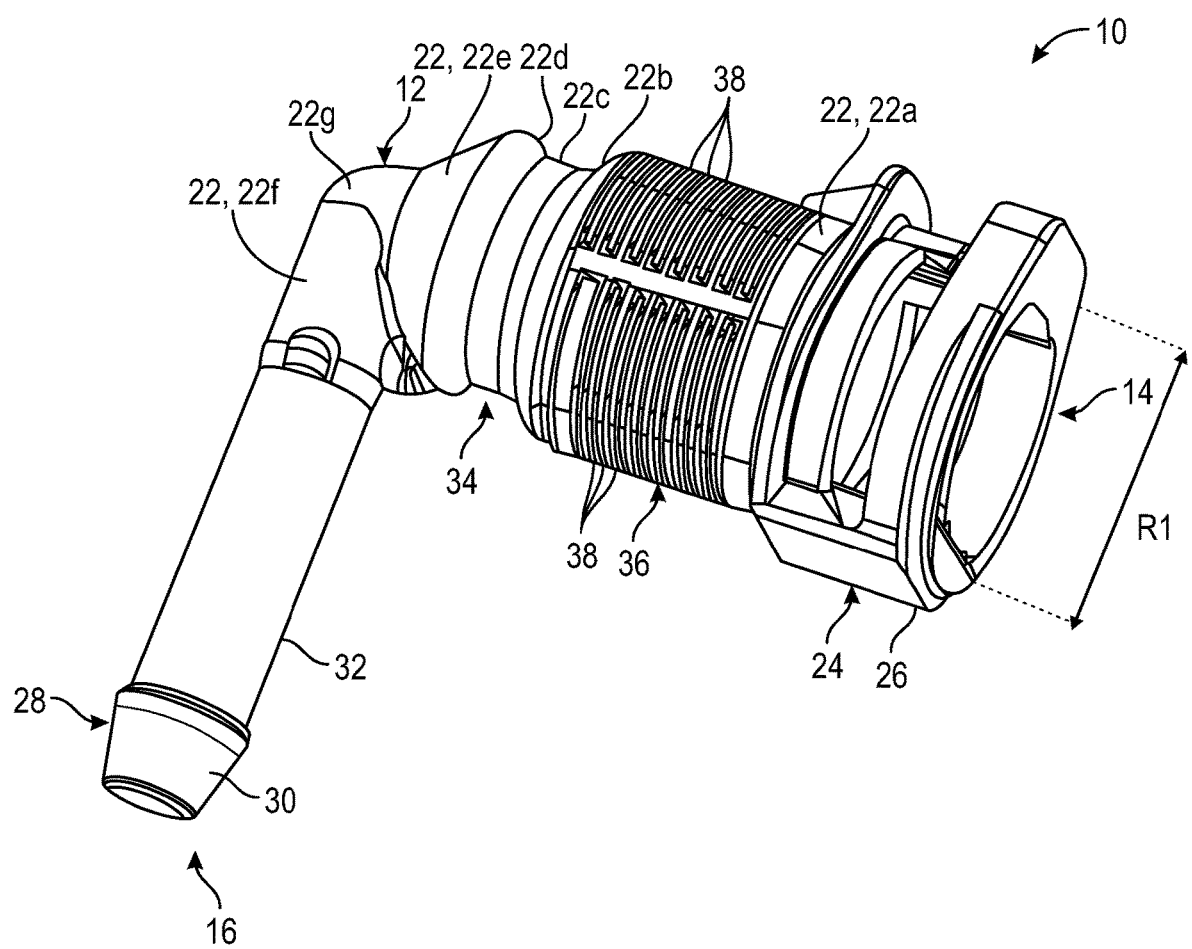
FIG. 1 is a schematic perspective view of a fluidic connection and fluid heating device according to one embodiment of the invention.
Figure 2:
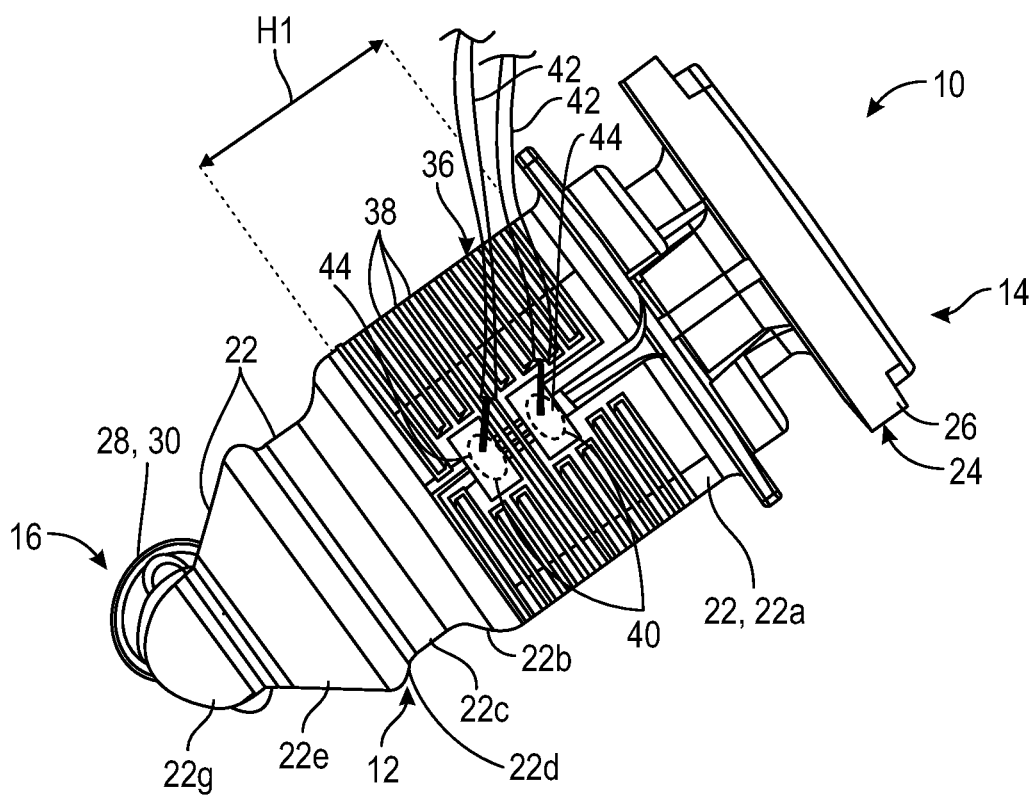
FIG. 2 is another schematic perspective view of the device of FIG. 1.
Figure 3:
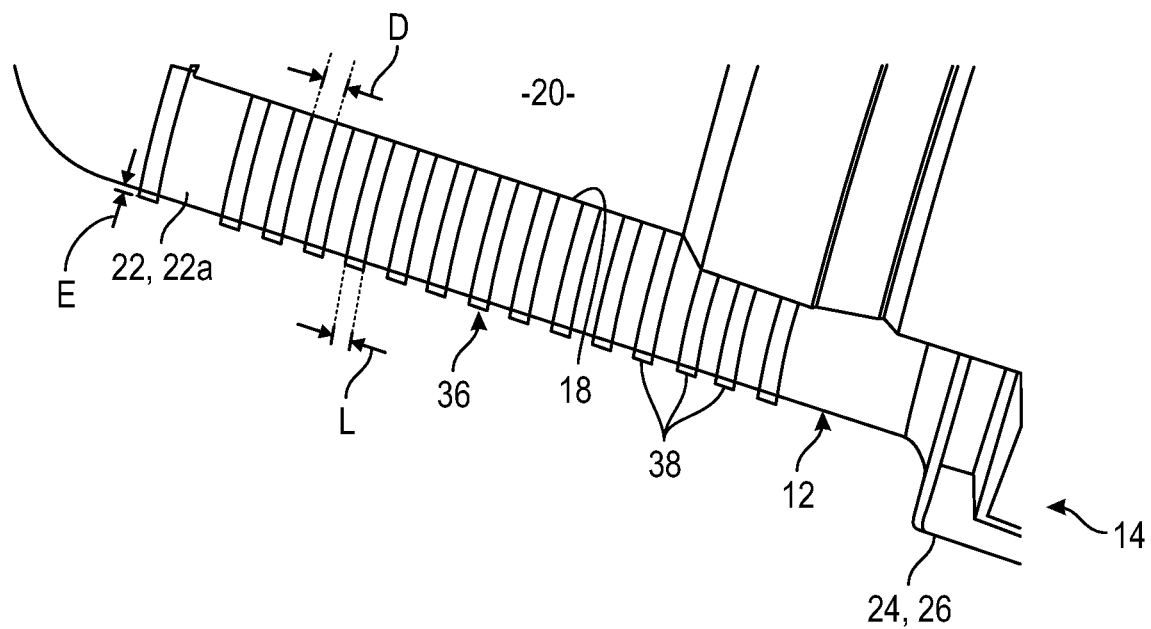
FIG. 3 is a larger scale schematic view of a detail of the device in FIG. 1.

FIGS. 1 to 3 illustrate an embodiment of a device 10 according to the invention for fluidic connection and fluid heating. The device 10 is particularly designed for use in a motor vehicle.

The fluid can be a gas or a liquid. Examples include fuel, coolant, blow-by gas from an internal combustion thermal engine, etc.

The device 10 is part of a fluid circuit such as a fuel supply circuit, an air conditioning circuit, a vacuum brake circuit, an SCR circuit, etc.

As its name indicates, the device 10 has a double function of fluidic connection and heating of the fluid it conveys.

To ensure the fluidic connection, it naturally comprises fluidic connection means and, to ensure the heating, it comprises heating means.

The device 10 comprises a body 12 that is generally tubular in shape and is one-piece. This body 12 can have a straight or angled shape, as in the example shown. It is one-piece, i.e., it is formed in one part, although additional elements such as attachment elements could be fitted and attached to the body 12.

The body is made of plastic or composite material, for example thermoplastic in particular. It can be manufactured by injection-moulding for example.

The body 12 comprises a fluid inlet 14 and a fluid outlet 16. The body 12 further comprises one or more internal annular surfaces 18 that define a flow duct 20 of the fluid from the inlet 14 to the outlet 16 of the body. FIG. 3 is a cross-sectional view of the device 10 and allows to show one of these surfaces 18.

In the example shown, the device 10 and thus the body 12 are angled and the transverse dimension of the body 12 varies, and in particular decreases, from the inlet 14 to the outlet 16. It is therefore understood that the internal surfaces 18 are not all coaxial and of the same diameter.

The body 12 comprises a plurality of external annular surfaces 22 that extend around the duct 20 from the inlet 14 to the outlet 16 of the body 12.

A first fluidic connection means 24 is located at the inlet 14 of the body 12 and comprises a cage 26 forming a female portion and intended to receive an end-piece forming a male portion. This cage 26 is configured to cooperate with a locking member intended to prevent accidental disengagement of the end-piece from the device 10. One or more seals can be used to ensure the sealing of the connection. This type of fluidic connection is well known to the person skilled in the art.

A second fluidic connection means 28 is located at the outlet 16 of the body 12 and is of the fir-tree type, which here comprises a single annular anchoring rib 30 projecting from a section 32 of the body 12. This section 32 of the body 12 is intended to be forcibly engaged in the end of a pipe and the anchoring rib 30 is configured to ensure that this section is held in the pipe. This type of fluidic connection is well known to the person skilled in the art.

From the cage 26 to the section 32, the body 12 comprises a plurality of surfaces 22 and successively a cylindrical surface 22a, one or more annular surfaces 22b (22c, 22d) defining an annular gorge 34, a frustoconical surface 22e, and another cylindrical surface 22f. The link of the frustoconical surface 22e to the cylindrical surface 22f is realized at the level of the elbow of the body 12 by means of a surface 22g in section of sphere.

The heating means comprise at least one resistive heating element located on at least one of the surfaces 22a-22f of the body 10.

According to the invention, the resistive heating element is a resistive circuit 36 that is formed in situ on at least one of the surfaces 22a-22f of the body 10.

The circuit 36 is thus formed directly on the body 10. In the preferred embodiment of the invention where the circuit 36 comprises at least one elongated resistive track 38 whose longitudinal ends are connected to electric connection terminals 40, the track 38 and the terminals 40 are formed directly on the body 12.

The conductive and resistive material of the circuit 36 is therefore in contact with the material of the body 12, which is not conductive. However, it is possible to provide a passivation layer or dielectric layer between the circuit 36 and the body 12. As an alternative or additional characteristic, such a passivation layer can be provided on the circuit 36 to protect it from the outside atmosphere.

Figure 5:
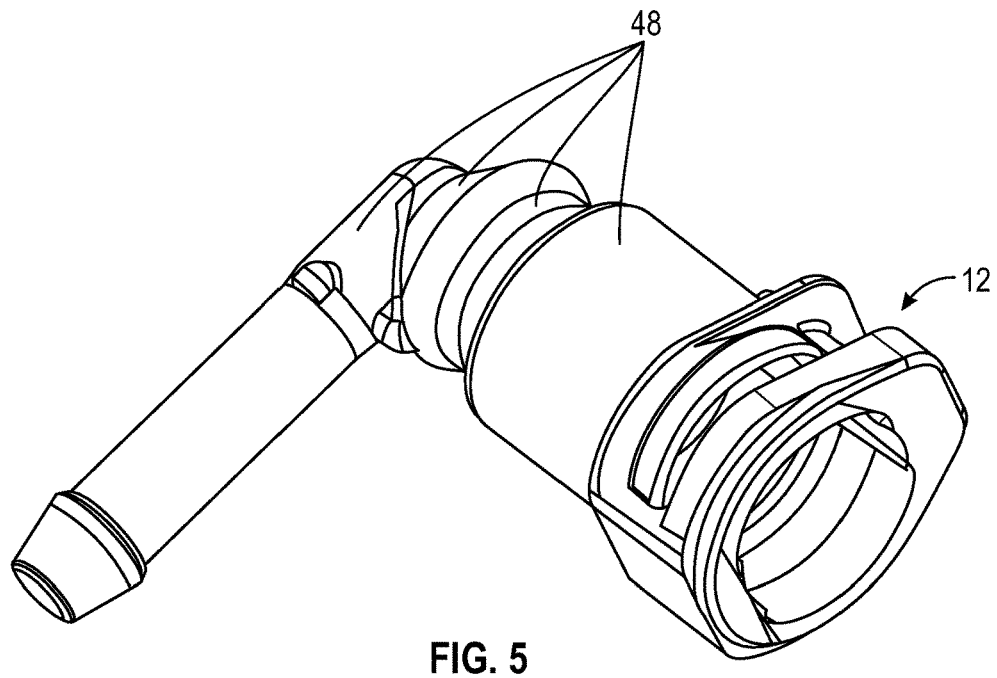
FIG. 5 is a schematic perspective view of a fluidic connection and fluid heating device covered with a coating material.

The body 12 may be coated in a coating material 48, such as an elastic thermoplastic, as seen in FIG. 5. This coating material 48 covers and protects the circuit 36.

As discussed above, one or more tracks 38 extend between the terminals 40. In the example shown, only one track 38 has its longitudinal ends connected to the terminals 40. This track 38 advantageously forms a serpentine with several straight lines (and curved because of the annular shape of the surfaces 22 of the body 12) and several U-shaped round trips.

The or each track 38 can have a length greater than or equal to 5 mm, or even 100 mm, or even more. The or each track 38 (or track section) may have a width L greater than or equal to 80 µm, and preferably greater than or equal to 100 µm (FIG. 3). This width is preferably less than or equal to 5 mm. The or each track 38 may have a thickness of less than or equal to 10 µm (FIG. 3).

Each section of the or each track 38 may be arranged to always be apart with a distance D of between 100 µm and 5 mm from one or more adjacent track sections or from the terminal or the terminals (FIG. 3).

In a particular embodiment of the invention, L≤D≤80 mm. The minimum distance between two sections or laps of track can be comparable to the width L of the track, which is for example about 100-300 µm.

The terminals 40 may have a general rectangular shape with dimensions of, for example, 1 mm×1 mm or 1 mm×2 mm.

Figure 4:
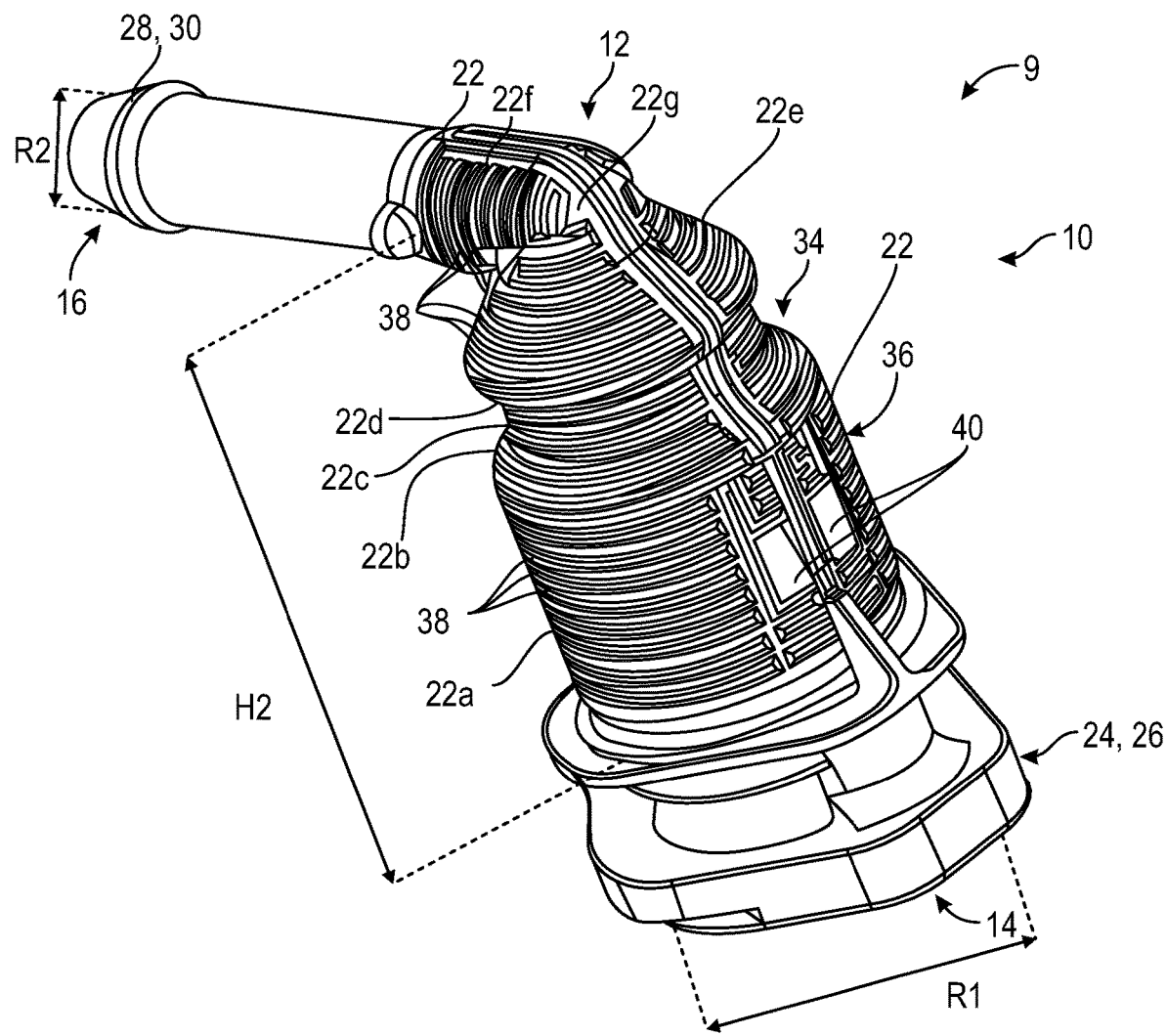
FIG. 4 is a schematic perspective view of a fluidic connection and fluid heating device according to an alternative embodiment of the invention.

The embodiment of FIGS. 1 to 3 shows a resistive track 38 that extends between the terminals 40 and over the surface 22a, and in particular around its entire circumference. The alternative embodiment of FIG. 4 shows a resistive track 38 that extends between the terminals 40 all around the surfaces 22a-22f including the bottom of the gorge 34.

The circuit 36 may extend over a surface or surface area of at least 10 cm². The circuit 36 may have a length H1, H2 of between 5 and 100 mm, and a diameter R1, R2 of between 6 and 80 mm. The circuit 36 can be configured to provide a thermal power of between 0.5 and 10 W. The device 10 can be heated to have a maximum temperature of between about 20 and 90° C., and preferably between 40 and 60° C.

In the examples shown, the terminals 40 are located in close proximity to each other on the surface 22a. They are preferably made of the same conductive and resistive material as the track 38.

These terminals 40 are used to electrically connect the circuit 36 to a monitoring and control device of the heating (not shown). The connection can be made by means of two conductor wires 42 whose longitudinal ends are welded respectively to the terminals 40. It is therefore understood that the terminals 40 are advantageously sized to receive a welding point 44 of one end of one of the wires 42. The terminals 40 are therefore oversized in relation to the track 38, and in particular widened.

Figure 2A:
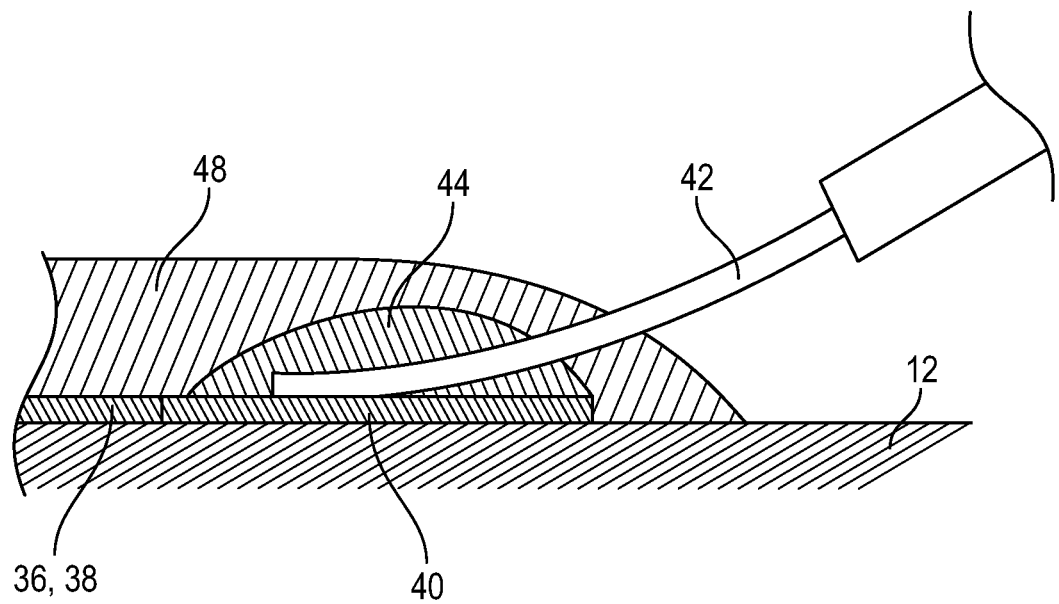
FIG. 2a is a very schematic cross-sectional view of a device and shows more specifically the electric connection of a wire to a terminal of the resistive circuit of the device.

In the aforementioned case where a passivation layer covers the circuit 36, it is understood that, if this layer is deposited before the electric connection of the terminals 40, the passivation layer will be deposited on the track 38 and will not be deposited on the terminals to allow the deposition of the welding points 44. If the passivation layer is deposited after the electric connection of the terminals, this layer can cover the tracks as well as the welding points. In the aforementioned case of using a coating material 48, it may be designed to provide a retention of the points 44 and the wires 42 on the body 12. FIG. 2a illustrates an embodiment showing these characteristics.

Figure 2B:
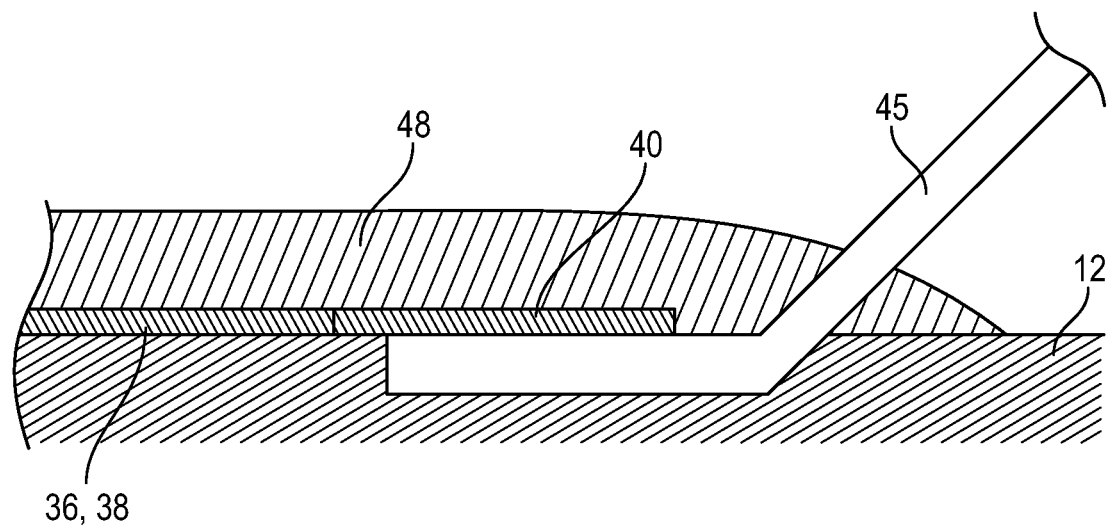
FIG. 2b is a very schematic cross-sectional view of a device and shows more specifically the electric connection of a lug to a terminal of the resistive circuit of the device.

FIG. 2b illustrates a variant in which the electric connection of the electric terminals to a wire or to a lug is not realized by welding (FIG. 1) but by simple contact. In the case illustrated in FIG. 2b, the contact is made by integrating the lug 45 in the body 12 of the device and then depositing or forming the track 38 and the terminal 40 on the body and the lug. The circuit and the contact area of the terminal 40 on the lug 45 are then coated with the coating material 48.

The circuit 36 can be formed in situ on the body in several ways, and in particular by a moulded interconnect device technique. The moulded interconnect device includes all techniques for printing printed electronics or selective metallization on a rigid substrate of plastic or composite material in three dimensions, and is also known as MID (which is the acronym for Moulded Interconnect Device).

The circuit 36 may be made, for example, by a technique selected from printing a resistive or conductive ink and selective metallization.

The ink can be printed by inkjet printing for example.

The selective metallization can be realized by two-material injection, of a first electrically conductive and resistive material and a second, non-electrically conductive material into a mould for manufacturing the body. It is understood that the first material will form the tracks 38 and the terminals 40 and the second material will form the rest of the body 12.

Alternatively, the first material could be non-conductive but only comprise an additive (such as copper seeds) to facilitate the attachment of the circuit 36.

Figure 6A:
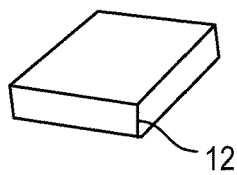
FIGS. 6a to 6f are highly schematic views of an injected plastic body being metallized, and illustrate an LDS metallization method.
Figure 6B:
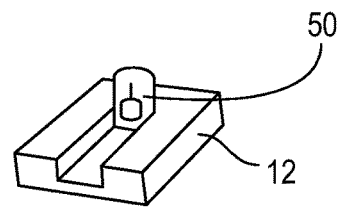
Figure 6C:
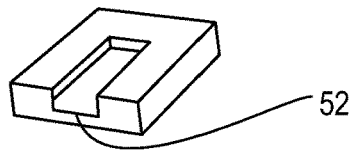
Figure 6D:
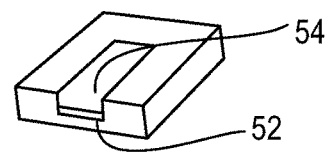
Figure 6E:
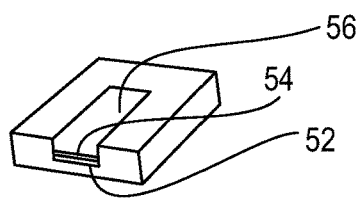

Alternatively, the selective metallization can be realized by LDS (Laser Direct Structuring) technology, which is one of the MID technologies that allows to produce tracks on complex injected parts. The body 12 is manufactured from a material incorporating an organometallic additive (FIG. 6a). Next, a laser beam 50 directly etches the tracks to activate the material by means of a physicochemical method between the additive and the laser (FIG. 6b). For the thin circuits, the metallization is realized by non-electrolytic deposition. Once this material has been activated, the body is immersed in different baths containing metal ions (copper, then nickel, then gold) in order to realize several successive deposits 52, 54, 56 of metal in the activated area (FIGS.

Figure 6F:
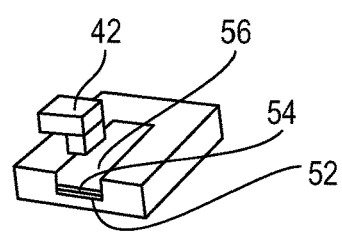

6c-6e). The successive layers are for example of the type Cu/Ni/Au, Cu/Ni/Ag, Cu/Ni/(Pd/Au), Ni/Pd/Au, Cu/Ni, Cu/Sn, etc. The last step consists of welding the wires 42 as mentioned above (FIG. 6*f*).

The thicknesses of the metal layers are for example;
Cu=15 µm max (preferably between 4 and 10 µm)
Ni=20 µm max (preferably less than 15 µm)
Au=1 µm max (normally 0.1 µm with tolerance of ±0.05 µm)

The relatively thick layers (more than 15 µm in the case of copper) are manufactured by electrolytic deposition, i.e. electroplating.

The metallizable polymers are thermoplastic polymers, liquid crystal polymers (LCP), some thermosetting resins and some cross-linked elastomers. For the applications requiring a high temperature resistance (110-150° C.), the PA and PPA, PPS type thermoplastics are preferable.

An LDS-compatible polymer typically comprises an additive adapted to produce seeds on the surface of the body by being activated by laser. It can be a copper-chromium oxide (CuO—$Cr_2O_3$) or an organic complex of Cu or Pd. Typically, a polymer of this type comprises between 1 and 15% by weight of LDS additive, the remainder being formed by the polymer matrix and any reinforcing fillers.

Several materials are currently available on the market for LDS applications, including TECACOMP® PEEK LDS black 3980 marketed by the company Ensinger, and the material Preperm 260 LDS (PPE) marketed by the company Premix.

There are also metallizable paints. The paint is sprayed onto a conventional polymer (without LDS additive) to make it metallizable.

Figures 7A, 7B, 7C, 7D, 7E:
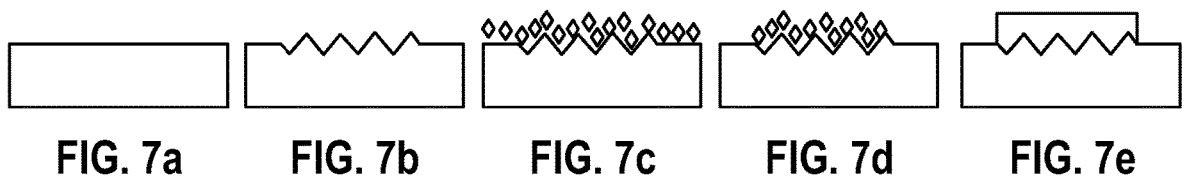
FIGS. 7a to 7e are highly schematic views of a plastic body being metallized, and illustrate a laser-assisted selective metallization method (optional step) with a chemical activation step.

Alternatively, the first material could be non-conductive and not contain a laser-activatable additive. The roughness of the surface of the body could be increased by a laser treatment. The activation of the surface could be realized chemically, as illustrated in FIGS. 7*a* (e.g., plastic injection), 7*b* (optional laser activation), 7*c* (chemical activation), 7*d* (rinsing for selective cleaning of particles from the inactivated surface), and 7*e* (non-electrolytic selective metallization). As an example, this activation could be realized by a treatment of the body with a colloid solution (Laser Induced Selective Activation, LISA), typically Pd—Sn chloride. Another example consists in using a non-colloid solution (technology Selective Surface Activation by Laser, SSAIL), such as Ag nitride. The body is then rinsed so as to remove particles of activation solution from the untreated surface, and then metallized by immersion in a chemical metallization bath (as per the previous protocol).

Figure 8:
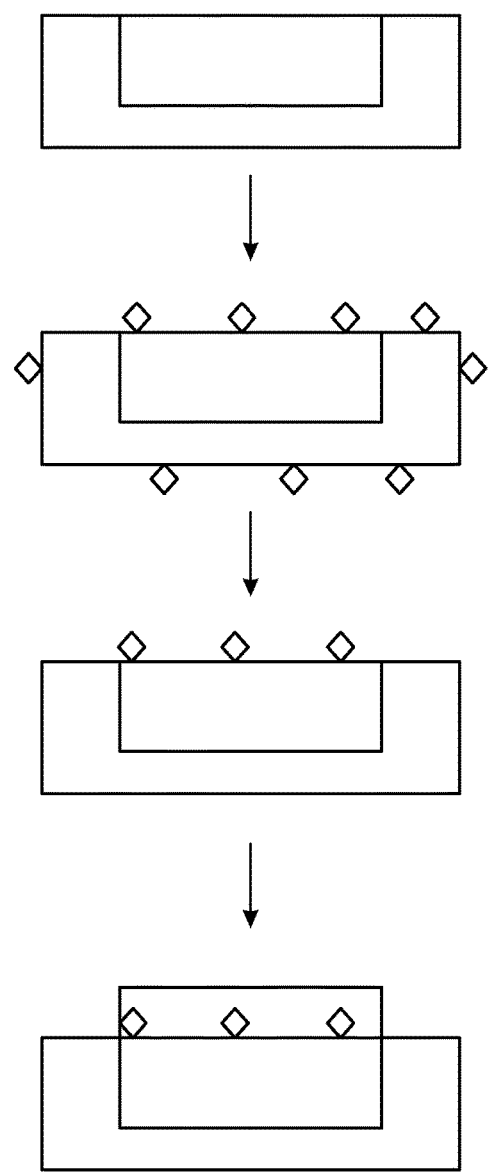
FIG. 8 is a very schematic view of a plastic body being metallized, and illustrates a two-material injection metallization method.

Another type of metallization is the metallization referred to as Two Shot Moulding or 2K Moulding, which is illustrated in FIG. 8 (from top to bottom, Two Shot Moulding, Chemical Activation, Selective Rinsing and Selective Metallization). The plastic part is moulded in two successive injections, by a metallizable material and a conventional material. The first plastic is treated with a chemical mordant (such as a chromium acid or potassium hydroxide), and then the circuit is liquid deposited similar to the LDS (preferred non-electrolyte deposition) technique. The metals used, the thickness of the manufactured circuit and the control of the method are similar to those of the LDS technique.

These moulded interconnect device technologies allow to bring the heating function directly on the plastic body by decreasing the number of components (wires) which lowers the cost especially the labour cost.

There are other selective metallization techniques, such as those known as Hot Embossing or Plasmacoat 3D®. The first technique can shape metallic patterns by stamping on polymers with a low glass transition temperature (Tg). As for Plasmacoat 3D®, it is the spraying of a metal through a plasma torch. This method allows the deposition of metallic patterns in copper or zinc for example.

The invention claimed is:

1. A fluidic connection and fluid heating device for a fluid circuit, in particular for a motor vehicle, this device comprising:
   a one-piece tubular body made of plastic or composite material, the body comprising:
      an inlet and an outlet each equipped with fluidic connection means, which are of the press-fit or male/female cooperation type,
      at least one internal annular surface defining a fluid flow duct from the inlet to the outlet of the body,
      at least one cylindrical or frustoconical surface extending around the duct and defining an outer surface of the body, and
   at least one resistive heating element located on and extending around and along the at least one cylindrical or frustoconical surface,
   wherein the resistive heating element is a resistive circuit which comprises at least one elongated resistive track whose longitudinal ends are connected to electric connection terminals which are oversized relative to the or each track so as to be connected to electrical wires or lugs, the circuit being secured and formed directly on the at least one cylindrical or frustoconical surface.

2. The device of claim 1, wherein the resistive track forms a serpentine.

3. The device of claim 1, wherein the resistive track has a width (L) less than or equal to 5 mm.

4. The device of claim 3, wherein the width of resistive track is less than or equal to 1 mm.

5. The device of claim 1, wherein the circuit extends all-around the at least one cylindrical or frustoconical surface.

6. The device of claim 1, wherein the circuit extends continuously over a plurality of adjacent cylindrical or frustoconical surfaces.

7. The device of claim 1, wherein the circuit extends over the entire circumference of a bottom of an annular gorge.

8. The device of claim 1, wherein the circuit has a thickness (E) less than or equal to 0.5 mm.

9. The device of claim 1, wherein the circuit extends over a surface area of at least 100 $mm^2$, and preferably at least 250 $mm^2$.

10. The device of claim 1, wherein the circuit has a length (H1, H2) of between 5 and 100 mm, and a diameter (R1, R2) of between 6 and 80 mm.

11. The device of claim 1, wherein the circuit is configured to provide a thermal power between 0.5 and 10W.

12. The device of claim 1, wherein the circuit is at least partially covered and protected by a coating material of the body.

13. A fluid circuit, in particular for a motor vehicle, comprising at least one device of claim 1.

14. The circuit of claim 13, wherein it is a Selective Catalytic Reduction circuit.

15. A method for manufacturing a device of claim 1, wherein it comprises a step of realizing the circuit by a technique selected from printing a resistive or conductive ink and the selective metallization.

16. The method of claim 15, wherein the selective metallization is realized by laser followed by immersion in one or more metallization baths.

17. The method of claim 16, wherein the material of the body comprises an additive intended to be laser activated and to facilitate the attachment of one or more metal layers during the immersion or the successive immersions.

18. The method of claim 16, wherein the body is made by two-material injection into a mould, of a first material having an affinity for an electrically conductive and resistive material, and a second, non-electrically conductive material.

19. The method of claim 15, wherein the ink is printed by inkjet or aerosol jet or stamping.

\* \* \* \* \*